(12) United States Patent
Chambers et al.

(10) Patent No.: US 6,915,468 B2
(45) Date of Patent: Jul. 5, 2005

(54) APPARATUS FOR TESTING COMPUTER MEMORY

(75) Inventors: Adam Richard Maurice Chambers, Stoke-on-Trent (GB); Malcolm George Simmonds, Stoke-on-Trent (GB)

(73) Assignee: Sun Microsystems, Inc., Santa Clara, CA (US)

(*) Notice: Subject to any disclaimer, the term of this patent is extended or adjusted under 35 U.S.C. 154(b) by 639 days.

(21) Appl. No.: 09/925,844

(22) Filed: Aug. 8, 2001

(65) Prior Publication Data

US 2002/0078408 A1 Jun. 20, 2002

(30) Foreign Application Priority Data

Aug. 8, 2000 (GB) .............................. 0019518

(51) Int. Cl.[7] .............................................. G11C 29/00
(52) U.S. Cl. ...................................................... 714/719
(58) Field of Search ................................ 714/718–719

(56) References Cited

U.S. PATENT DOCUMENTS

| 4,718,065 | A | | 1/1988 | Boyle et al. |
| 4,736,375 | A | | 4/1988 | Tannhäuser et al. |
| 5,991,898 | A | * | 11/1999 | Rajski et al. ................. 714/30 |
| 6,668,347 | B1 | * | 12/2003 | Babella et al. .............. 714/733 |

OTHER PUBLICATIONS

TechEncyclopedia entry "state machine" copyright© 1981–2005 The Computer Language Company Inc. URL:http://www.techweb.com/encyclopedia/defineterm.jhtml;jsessionid=JRNYKEFXMAKZSQSNDBCSKHOCJUMEKJVN?term=state+machine+&x=13&y=10.*

C. A. Papachristou, F. Martin, M. Nourani; Microprocessor based testing for core–based system on chip; Jun. 1999; Proceedings of the 36th ACM/IEEE conference on Design automation; pp 586–591.*

UK Search Report application No. GB0019518.0, mailed Feb. 5, 2002.

* cited by examiner

*Primary Examiner*—R. Stephen Dildine
(74) *Attorney, Agent, or Firm*—Meyertons Hood Kivlin Kowert & Goetzel, P.C.; B. Noël Kivlin

(57) ABSTRACT

An electronic memory device tester has an input arranged to receive seed data with a first number (p) of seed data bits from a computer and a data generator arranged to receive an array of prepared data having a second number (q) of prepared data bits, where q>p, and arrange to generate from the prepared data a test data pattern for writing to an electronic memory device to be tested. The tester generates its own test pattern thus relieving the computer processor from that task. This in turn allows the computer to control the test cycle itself without compromising the test speed.

31 Claims, 11 Drawing Sheets

APPARATUS FOR TESTING COMPUTER MEMORY

The present invention relates generally to an apparatus for testing computer memory and particularly to an apparatus for testing large capacity, wide data bus width memory such as Dynamic Random Access Memory (DRAM).

BACKGROUND OF THE INVENTION

As will be familiar to those skilled in the art, Dynamic Random Access Memory (DRAM) is a type of RAM that has high-density storage, but requires regular refreshing of its contents. Conventional test systems for DRAM utilise three typical designs. For example, the test system may utilise the hardware with which the DRAM is designed to operate, running special test software. Alternatively, a processor system may be employed to test the memory at full speed and all at once. A third option is to use a lower performance processor system that tests the memory in smaller pieces.

DRAM modules requiring test may have a wide data bus and large capacity. This is particularly the case when the DRAM is designed for a large system such as a file server or workstation. Testing a large capacity, wide data bus DRAM using the first two systems set out above is therefore expensive, because of the cost of the processor technology required to access the memory. The third system, although cheaper, starts to compromise on test speed and coverage.

It is an object of the present invention to address these problems with the prior art.

SUMMARY OF THE INVENTION

According to a first aspect of the present invention, there is provided an electronic memory device tester, comprising: an input, arranged to receive seed data which has a first number, p, of seed data bits, from a computer; and a data generator arranged to generate an array of prepared data having a second number, q, of prepared data bits, where q>p, and arranged to generate from the prepared data a test data pattern for writing to an electronic memory device to be tested.

The tester generates its own test patterns thus relieving the computer processor from that task. This in turn allows the computer to control the test cycle itself without compromising test speed. Thus, a slow cheap processor may be employed to test fast RAM designed for expensive computer systems. The invention also extends to a method of writing data to an electronic memory device to be tested, comprising the steps of: (a) generating, in a separate computer, seed data having a first number, p, of seed data bits; (b) receiving, in a memory tester, the seed data; (c) generating, from the received seed data, an array of prepared data having a second number, q, of prepared data bits, where q>p; (d) generating, from the prepared data, a test data pattern; and (e) writing the test data pattern to the electronic memory device to be tested.

In summary, the present invention provides a DRAM test system utilising a low performance central processor system connected using a standard PC104 bus system to a set of control logic that is capable of generating test patterns and sequences and controlling access times and parameters. The control logic forms the core of the invention providing full speed and full bus width access to the DRAM. It is capable of reading, writing and verifying data patterns to the DRAM and reporting the results back to the processor. Both fast page mode (FPM) and extended data out (EDO) DRAM types can be tested and provision is made so that any other types of RAM could be tested such as Static RAM (SRAM) and Synchronous DRAM (SDRAM).

The logic system does not compromise test coverage as a typical memory tester could. A typical memory tester will multiplex a smaller data bus to enable the low performance processor to access a much wider bus than it was originally designed for. The present invention uses its core logic to access the whole data bus of the memory under test at once. The processor can program the required data patterns, read back information that has been read from RAM and command the logic to perform various functions, but has no direct interaction with the RAM, relying instead upon the core logic to verify results. This means that the memory module is tested as a whole, increasing fault finding by simulating the DRAM target system. Also the overall time to test a module is faster as no repetition is required as would be if multiplexing were used.

BRIEF DESCRIPTION OF THE DRAWINGS

The invention may be put into practice in a number of ways, one of which will now be described by way of example only and with reference to the following drawings, in which.

DESCRIPTION OF THE PREFERRED EMBODIMENTS

Figure 1:
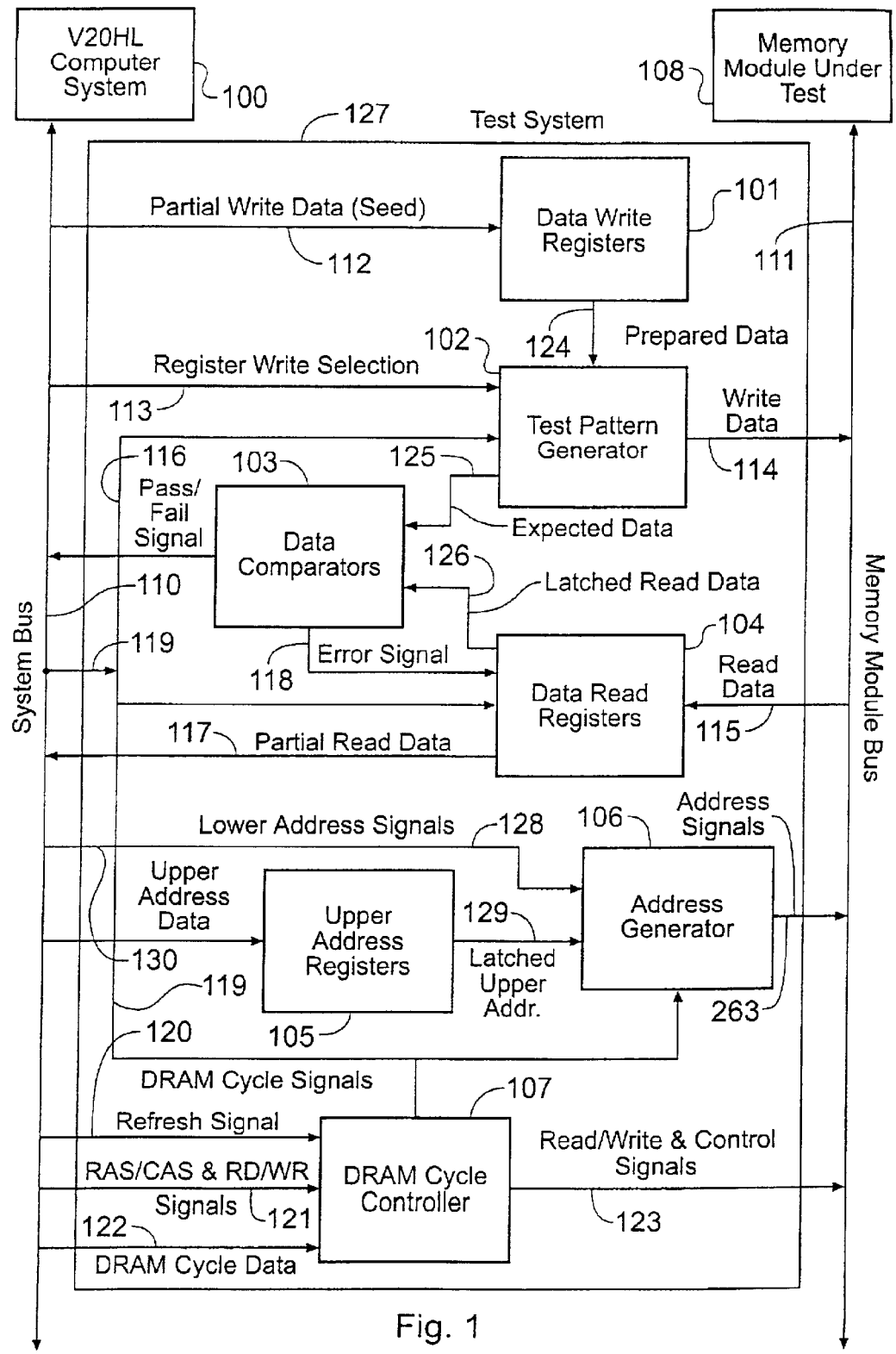
FIG. 1 shows a schematic block diagram of a test system embodying the present invention.

Referring to FIG. 1, a functional block diagram of a memory test system 127 embodying the present invention is shown. The system is controlled by a computer system 100 employing, for example, a V20HL microprocessor. A detailed diagram of the computer system 100 is shown in FIG. 2 and will be described in detail below. As seen in FIG. 1, the system is arranged to test a memory module 108.

The computer system 100 controls the test system 127 by means of data written to a system bus 110 using direct port output commands and memory write commands. The test system 127 tests the memory module 108 using a memory module bus 111. The results of tests carried out by the test system 127 are read back by the computer system 100 using input port commands and memory read commands. The test system 127 includes data write registers 101 for loading a "seed" (typically a single data byte) for a test pattern into a test pattern generator 102. The seed is obtained from the computer system 100 on partial write data line 112. The test pattern generator 102 creates various test patterns based on the prepared data from the data write registers 101, as well as commands from the computer system 100. Test patterns are also dependent upon a DRAM cycle controller 107, which outputs DRAM cycle signals 119 as set out below.

Data comparators 103 within the test system 127 compare expected data 125 with latched read data 126 and report back to the computer system 100. Data read registers 104 store read data from the memory module 108, and upper address registers 105 hold the most significant bits of an access address employed for accessing the memory module. This is supplied as upper address data 130 from the system bus 110. An address generator 106 combines lower address signals 128 read off the system bus 110 with latched upper address signals 129 from the upper address registers 105, and generates the access address based on the DRAM cycle signals 119 to the memory module 108. Finally, the DRAM cycle controller 107 receives a refresh signal 120, Row Address Strobe/Column Address Strobe (RAS/CAS) and read/write signals 121, and DRAM cycle data 122 obtained via the system bus 110 from the computer system 100. The DRAM cycle controller 107 then converts these signals into internal DRAM cycle signals 119 which are sent to the test pattern generator 102 and the address generator 106, and into read/write and RAS/CAS control signals 123 which are sent to the memory module under test 108. The RAS/CAS signals indicate to the DRAM that the address being presented upon the system bus 110 is intended for a row or column respectively.

Figure 2A:
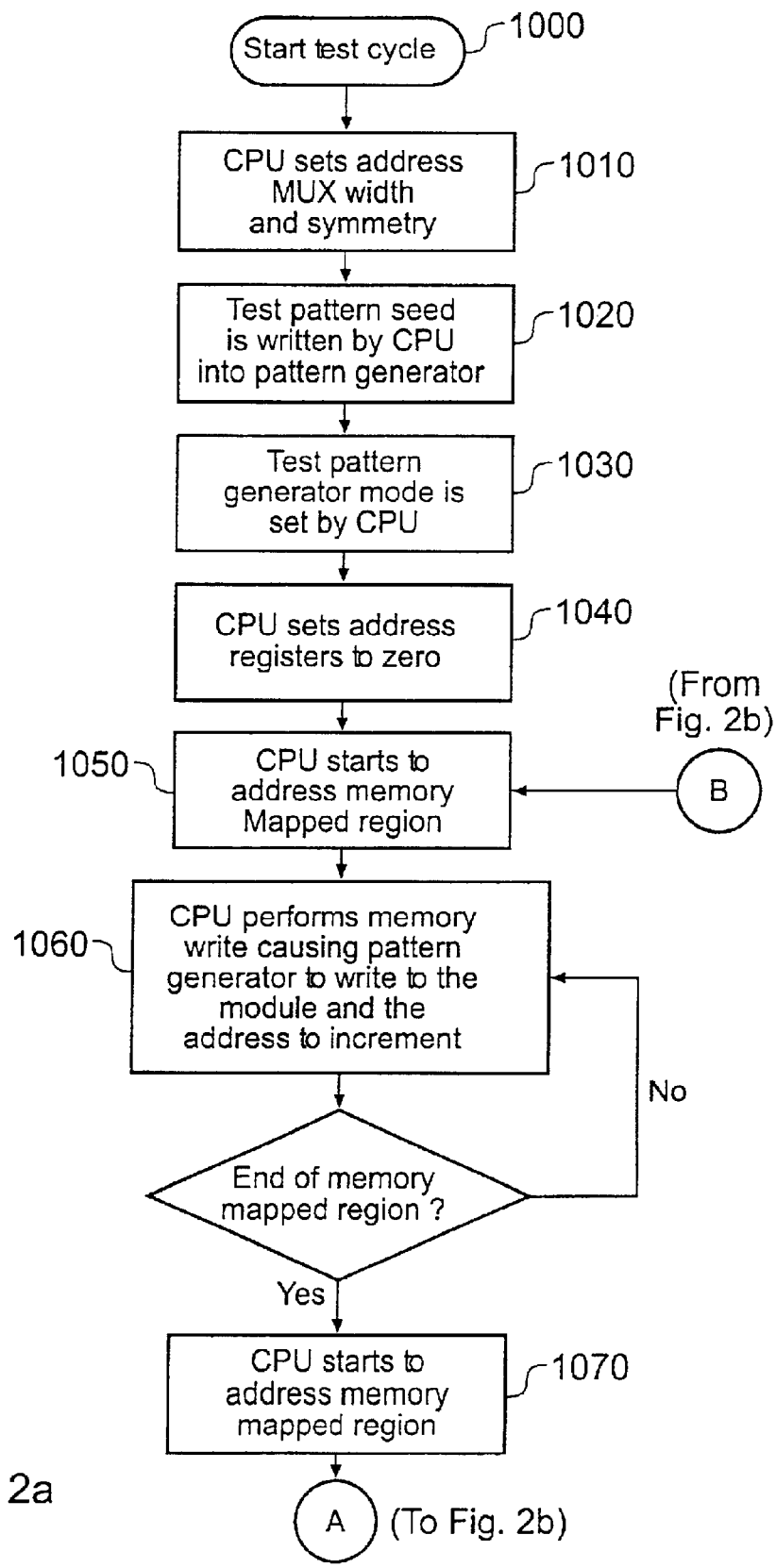
FIGS. 2a and 2b show a flow chart of the operation of the test system of FIG. 1.
Figure 2B:
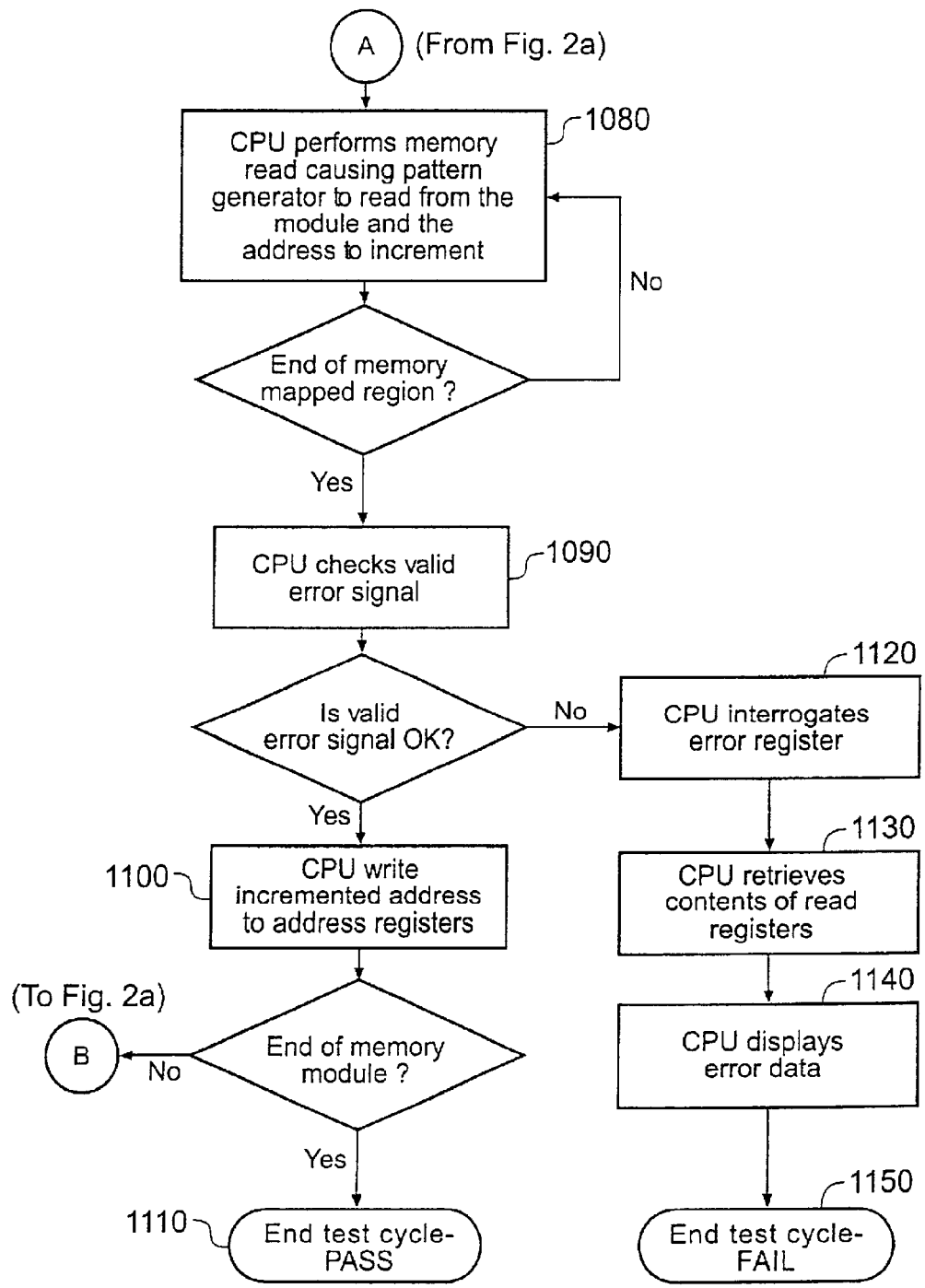

Referring now to the flow charts of FIGS. 2a and 2b (which are best understood with reference also to FIG. 1), a summary of the operation of the test system will now be presented.

The test system 127 is firstly powered up by connecting it to an external power supply (not shown). An internal battery could of course be used instead. Next, a memory module 108 to be tested is inserted into a socket provided in the system. Suitable software running on the computer system 100 then initiates a user-selected test, at step 1000 of FIG. 2a. To begin a test the following parameters need to be set in the computer system 100, and this is carried out at step 1010.

Firstly, the refresh rate of the system (which is dependent upon the refresh rate of the computer system 100 and that of the memory module under test 108) are specified. Secondly, the computer system 100 is informed of the capacity of the memory module 108, together with the data bus width of the memory module 108.

The software also allows the access cycle time, the RAS/CAS delay time, the RAS/CAS enable requirements, and the output/write enable requirements to be programmed into the DRAM cycle controller 107 from the computer system 100. The RAS/CAS enable requirements are defined by the number of RAS/CAS lines the memory module requires, and the output/write enable requirements are defined by the number of output/write enable lines the memory module requires.

Once these parameters are set, seed data can be loaded into the data write registers 101 from the computer system 100. The data write registers 101 grow the seed data into prepared data which is written to the test pattern generator 102 (step 1020). A test pattern mode is then selected in the test pattern generator 102 by software in the computer system 100, as shown at step 1030. The upper address lines are set in the upper address registers 105 at step 1040. A write cycle is then initiated by the computer system 100 at step 1050, which causes the selected test pattern to be written from the test pattern generator 102 to the memory module 108 using the latched upper address signals 129 and lower address signals 128 from the computer system 100 combined through the address generator 106 (step 1060). The DRAM cycle controller 107 synchronises the whole event using the DRAM cycle signals 119 internally, and the read/write and control signals 123 externally. The step 1060 repeats until the end of the memory mapped region is located.

In order to determine if the write cycle has been successful and that the memory module 108 is working correctly, a read cycle is performed. The computer system 100 initiates a read procedure (step 1070). The pattern generator 102 reads from the memory module 108 when requested to do so by the computer system 100. The read procedure is under the control of the DRAM cycle controller 107. The address that is read is incremented stepwise. This is shown in step 1080 (FIG. 2b).

During a data valid period of the memory module 108 (that is, during a period in which the DRAM is presenting the required data for reading onto the data bus), read data 115 is latched into the data read registers 104 and the write pattern is latched as the expected data 125 in the test pattern generator 102. The data comparators 103 then compare the expected data 125 with the latched read data 126. If the comparison fails, an error signal 118 is sent to the data read registers 104 which are then frozen. This allows the computer system 100 to read back the failure data in smaller pieces as partial read data 117. In order to verify the read success, the computer system 100 obtains a pass/fail signal 116 from the data comparators 103, via the system bus 110 and a pass/fail signal port (not shown in FIG. 1). One full cycle completes upon receipt of the pass/fail signal 116.

The use of the error signal 118 to freeze the data read registers 104 when an error occurs allows the computer system 100 to continue driving write cycles without obtaining pass/fail data 116 on every cycle. This allows the computer system 100 to use a small, fast write loop in software to drive the write cycle and then check the pass/fail data after a burst of cycles. Typically a burst of consecutive read and write-signals are transmitted and received, over a range of addresses covered by the lower address signals 128, until the end of a memory mapped region is located. When the upper address registers 105 need to be updated, the pass/fail signal port may be polled to determine if any errors occurred during the burst (step 1090). This increases the test speed of the system overall, as the computer system 100 (which is usually slower than the test system 127) is only required to perform two simple operations (write/read) in a loop.

Upon checking a valid error signal 208 (described further in connection with FIG. 6), if no errors are located (at least for that memory mapped region), then the computer system 100 writes an incremented address to the address registers, at step 1100. If the end of the addressable region of the memory module is reached, then the test procedure completes and indicates a PASS for the memory module at step 1110. Otherwise, the procedure reverts to step 1050 (FIG. 2a), so that the next memory mapped region is tested.

If, on the other hand, the error register indicates that errors exist, the computer system interrogates the error register at step 1120 and retrieves the stored contents of the read registers (step 1130). These may be displayed on the computer system 100 (step 1140). At this point, the test procedure terminates in a FAIL (step 1150).

It will be understood that, although the computer system 100 is performing memory read and write operations, it is not actually reading or writing any data to the memory module 108. The read and write operations allow the lower address signals 128 to be set and the cycle to be performed, but the test system 127 is actually writing, reading and verifying its own data (set in the data write registers 101 and test pattern generator 102). The computer system 100 makes no use of the data read back during these cycles. If failure data is required, the computer system 100 accesses the data read registers 104 and transfers the failure data in smaller pieces as partial read data 117.

The advantage of this procedure, as set out previously, is that the basic cpu can carry out one of its simplest write cycles in a burst sequence without worrying about what it is writing, or having to spend additional processing time checking for errors every cycle. In other words, the overall speed of the memory tester is significantly higher than with prior art testers, for a given processor speed.

A detailed description of the functional blocks of the test system 127 shown in FIG. 1 will now be provided, with reference to FIGS. 3 to 10. Features common to two or more drawings are labelled with like reference numerals.

Figure 3:
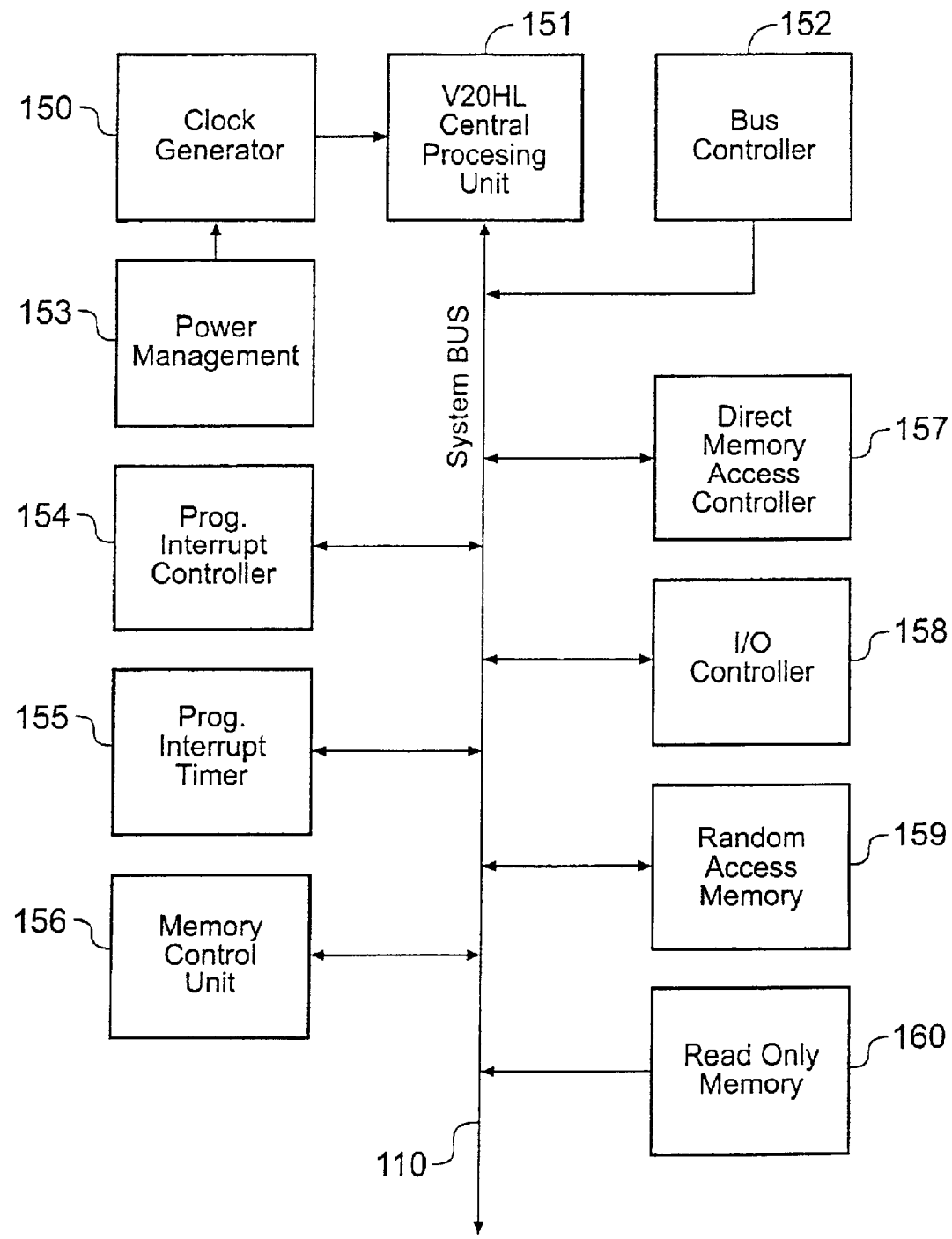
FIG. 3 is a block diagram showing the computer system of FIG. 1 in more detail.

Referring first to FIG. 3, a block diagram of the computer system 100 is shown. The computer system includes a central processing unit (CPU) 151 and is a 16 bit processor with an 8 bit external data bus and a memory addressing range of 1 Mb. The V20HL central processing unit, manufactured by NEC Corporation, or by Sharp could be used. It is, nevertheless, to be understood that other systems may be employed. For example, if testing a 512 bit memory, a 32 bit processor might be more suitable. The following description of a particular bit width is accordingly not to be considered limiting of the invention, whose scope is to be determined only by the appended claims.

The CPU 151 is accompanied by a clock generator 150 and a power management unit 153 that allows for reduced power consumption by reducing the clock speed to the CPU 151. Where the memory tester is powered by battery, this prolongs battery life. A bus controller 152 allows a Programmable Interrupt Controller (PIC) 154, Direct Memory Access (DMA) controller 157, Programmable Interrupt Timer (PIT) 155 and I/O controller 158 to communicate with the CPU 151 along a system bus 161. The DMA controller 157 controls direct access to the memory of CPU 151. The PIC 154 allows peripherals to interrupt the operation of the CPU 151. The PIT generates timed interval events for the processor. A memory control unit (MCU) 156 allows the CPU 151 to access internal RAM 159 and ROM 160. All devices communicate using the system bus 110.

The CPU 151 and its peripherals may be considered as a self-contained unit. Only the system bus 110 is extended beyond this system. In this preferred embodiment a PC104 bus (a simple bus that allows the CPU 151 to communicate with a number of peripherals) is used to extend all signals required from the CPU 151 and MCU 156. The signals employed by the test system 127 in FIG. 1 are described briefly in the table below.

It will be understood that these signals are widely used in a number of common computer systems.

TABLE 1

SYSTEM BUS SIGNAL DESCRIPTIONS

| Signal | Use in the embodiment of FIG. 1 |
|---|---|
| MRFRSH | Memory refresh (holds system during a refresh cycle) |
| IO | The type of address request is an input/output request |
| MEM | The type of address request is a memory access |
| DO-1 | Data bus signals |
| A0-20 | Address bus signals |
| RD | Access type is read |
| WT | Access type is write |
| MRAS | Memory row address strobe signal |
| MCAS | Memory column address strobe signal |

Figure 4:
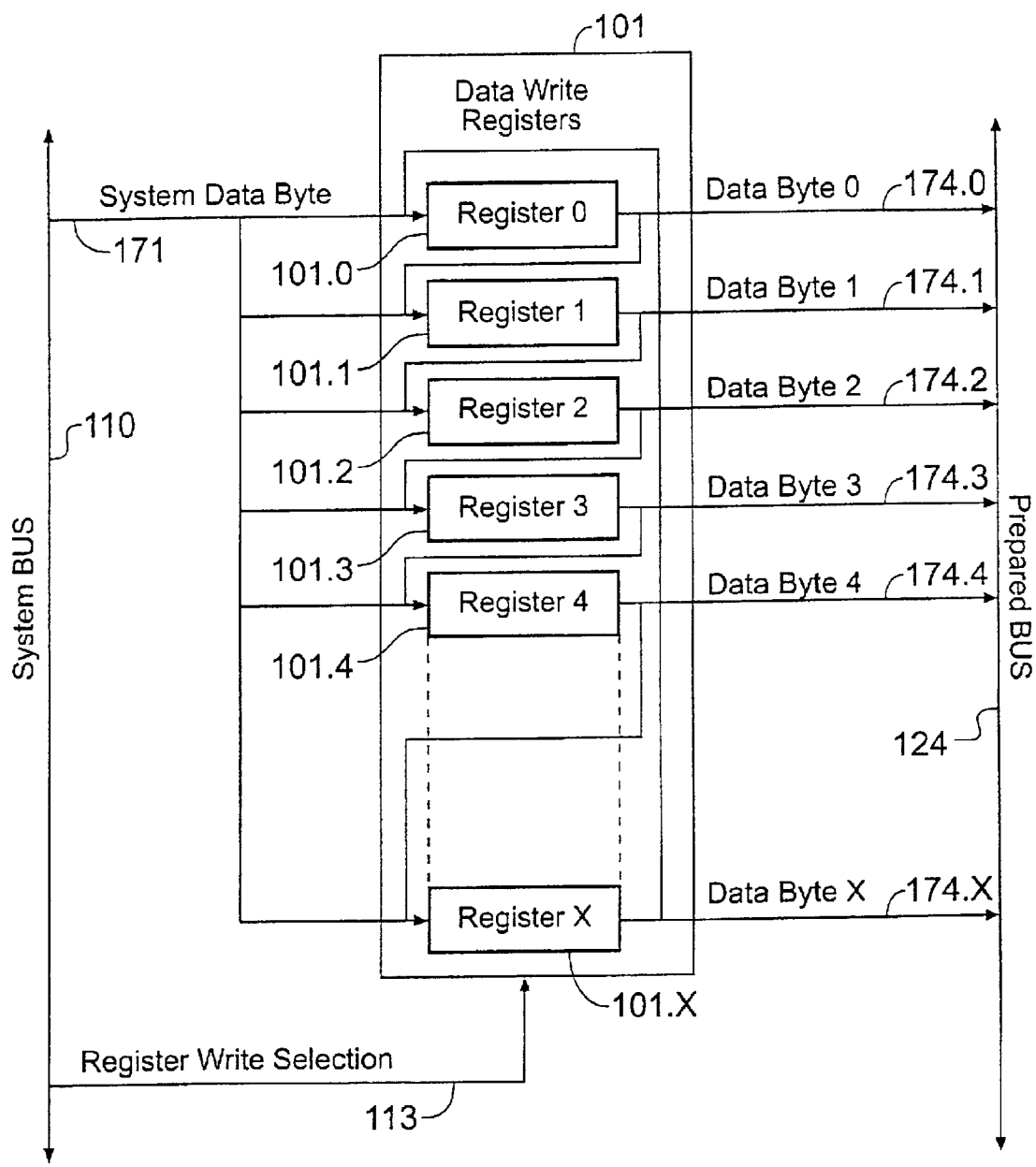
FIG. 4 is a block diagram showing the data write registers of FIG. 1 in more detail.

Referring next to FIG. 4, the data write registers 101 of FIG. 1 are shown in more detail. The data write registers comprise a plurality of data latches 101.0, 101.1, 101.2 . . . 101.X, one byte each, that are accessible individually by the system bus 110 using system data bytes 171. Each data latch is able to load a corresponding latch data byte 174.0, 174.1, 174.2, . . . 174.X onto a prepared data line as prepared data 124, to be sent to the test pattern generator 102. The output of an $n^{th}$ data latch 101.n is also used as an input to the subsequent $(n+1)^{th}$ data latch 101.n+1.

In the preferred embodiment of the invention, 18 byte wide registers are used to allow for testing of a 144 bit wide data bus on the memory module. To prepare the data for the test pattern generator 102, the computer system 100 writes individually to each latch with a byte, or to all the latches at once filling them all with the same data byte using a register write selection signal 113. The latter is the fastest and preferred method. The test pattern generator 102 then uses all data bytes in parallel. This design allows for a combination of rapid pattern preparation as well as the flexibility to write any data to the memory module 108 if required. Again, registers of other widths can be used for different data bus widths on the memory module to be tested.

The data write registers 101 may act as shift registers. This is a function that is a part of pattern generation, but is not carried out in the test pattern generator 102. As each write is performed, the data write registers 101 can rotationally shift the data pattern one bit to the left. This allows marching test patterns to be performed. For example, a binary pattern of all 0's and a 1 as bit 0 may be loaded into the register. The 1 may then be shifted on each write cycle.

Figure 5:
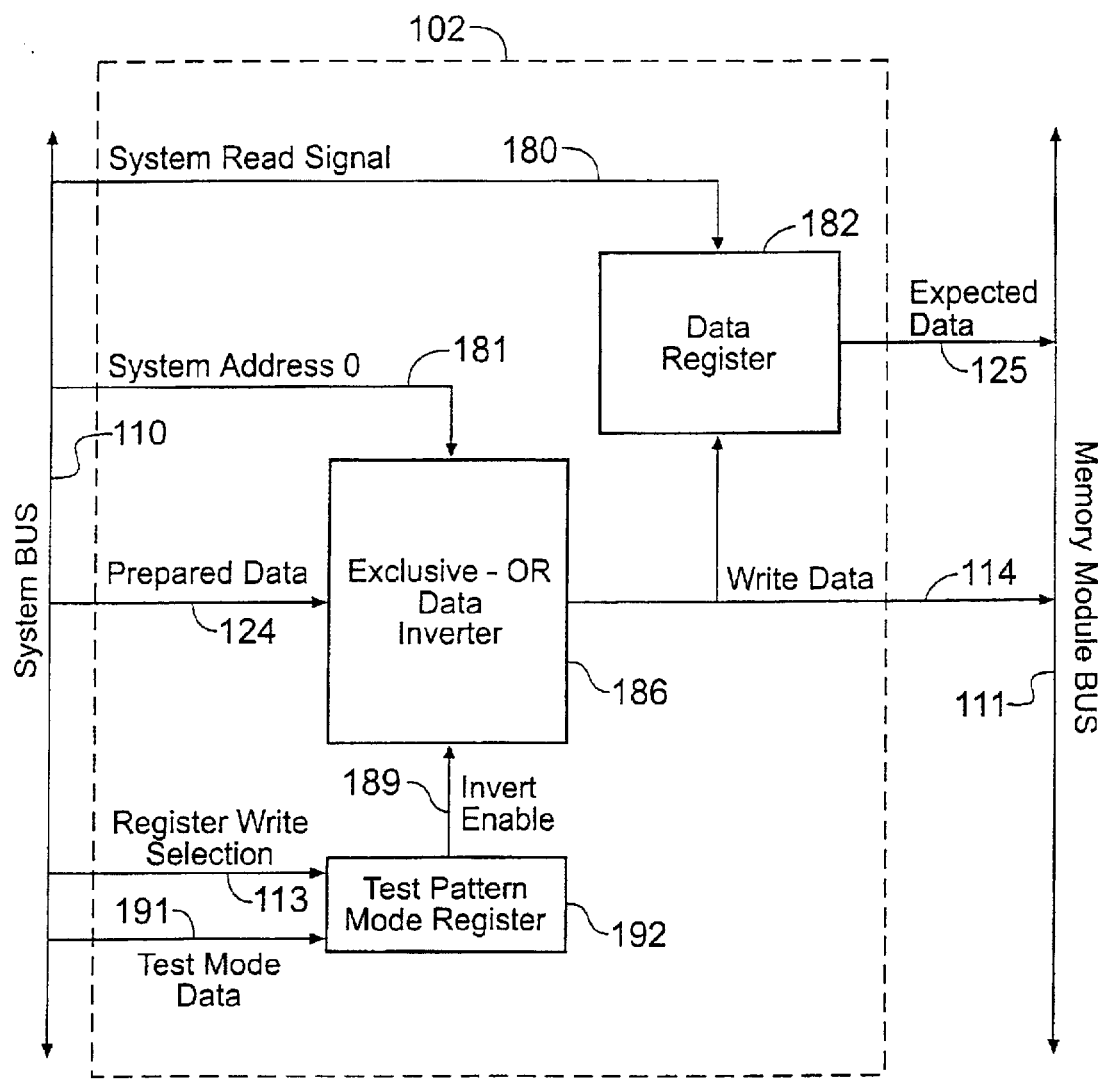
FIG. 5 is a block diagram showing the test pattern generator of FIG. 1 in more detail.

Turning now to FIG. 5, the test pattern generator 102 of FIG. 1 is shown in more detail. The test pattern generator comprises an exclusive OR data inverter 186 and a test pattern mode register 192. With nothing set in the test pattern mode register 192, the data present as prepared data 124 from the data write registers 101 is passed through the data inverter 186 and latched into a data register 182 without any shift being performed. This data is then presented as write data 114 on the memory module bus 111 where it awaits entry into the memory module 108 under test. The test pattern mode register 192 can be used to set the invert mode of the test pattern generator 102 and the shift mode of the data write register 101 as previously described.

If the invert mode is set, the exclusive OR data inverter 186 inverts the prepared data 124 when a system address line 0 (labelled 181 in FIG. 5) is high. Thus, on alternate addresses, the data presented as write data 114 is inverted, allowing easy generation of test patterns such as a checkerboard throughout a memory module. If the hexadecimal number 55 (binary 01010101) is loaded as prepared data 124 from the data write registers 101, then this number will be written to even addresses, and the inverse (binary 10101010 which is AA in hexadecimal) will be written to odd addresses.

When a read is performed, the data present as write data 114 is also latched into the data register 182 so that the data comparator 103 (FIG. 1) can compare the expected data 125 to the data read from the memory module 108. Because the write data 114 is only asserted onto the memory module bus 111 during a write cycle, it can be used as expected data during a read cycle. Test patterns are thereby continuously generated regardless of whether the cycle is read or write, thus providing a good data pattern during a read cycle.

Figure 6:
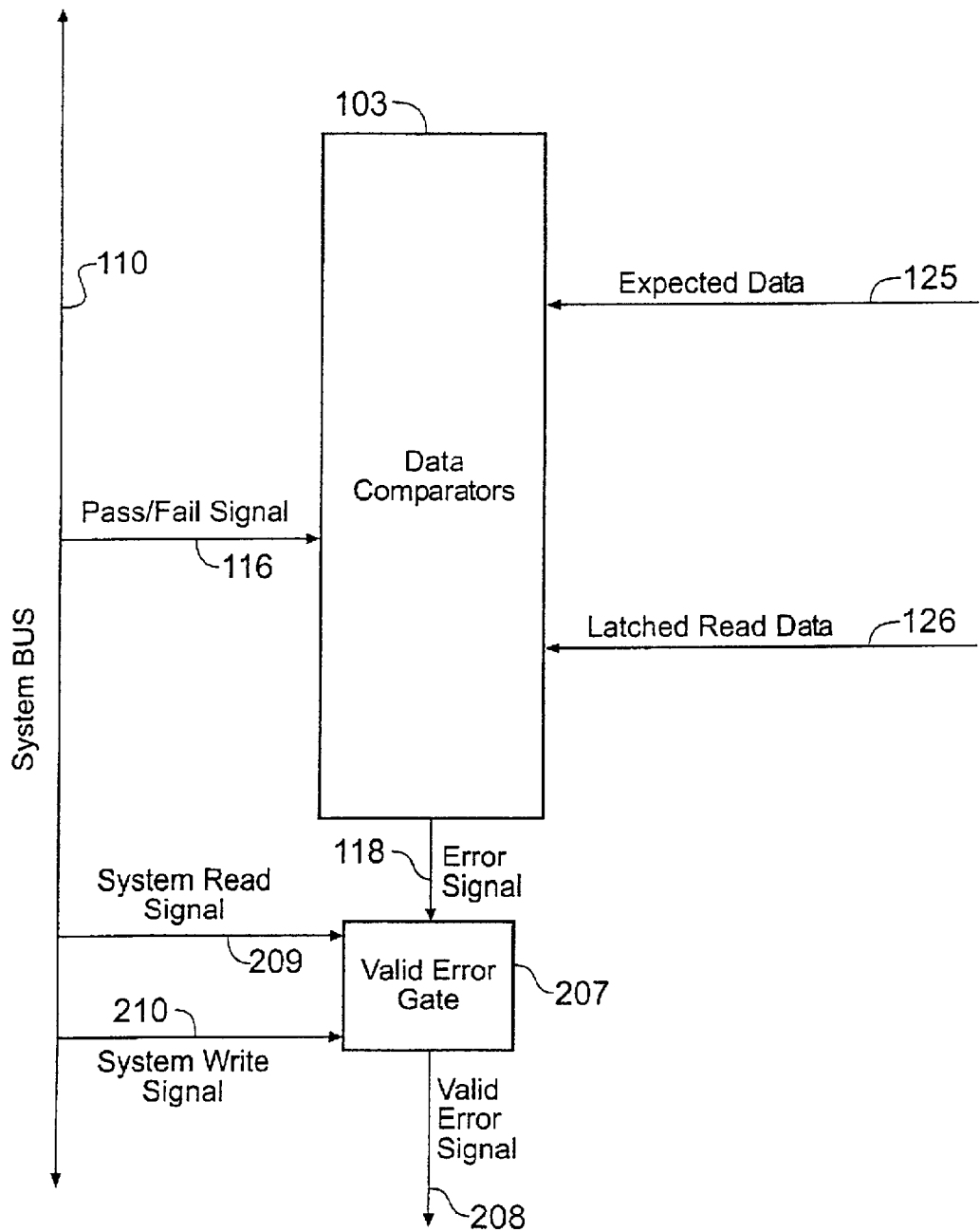
FIG. 6 is a block diagram showing the data comparators of FIG. 1 in more detail.

FIG. 6 shows the connections to and from the data comparators 103 of FIG. 1 in more detail. The data comparators 103 each comprise a multiple input exclusive-or gate. If there is any difference between the data presented as expected data 125 to the gate, and data presented as latched read data 126 to the gate, then an error signal 118 is generated which is then latched at the end of a valid read cycle (flagged by a systems read signal 209) using a valid error gate 207. The latched compare result is output from the valid error gate 207 as a valid error signal 208. The pass/fail signal 116 can be read back by the computer system 100 via the system bus 110 and contains one bit for each group of three bytes (6 bits), allowing a rapid decision to be made on which area has failed. The CPU needs only check that the pass/fail signal is not indicating a failure. This can be done after many "burst" reads form the CPU. Therefore, unless the pass/fail signal indicates a fail, the CPU does not need to read back the data that the tester has read via the "partial read data", at all. The only reason for reading back the partial read data is so that the CPU can display the result of a failure condition.

The valid error signal 208 is fed to the data read registers 104 (FIG. 1) and inhibits the registers from latching again until the error is cleared. This takes place when a new piece of data is written to the data write registers 101 using a system write signal 210.

Figure 7:
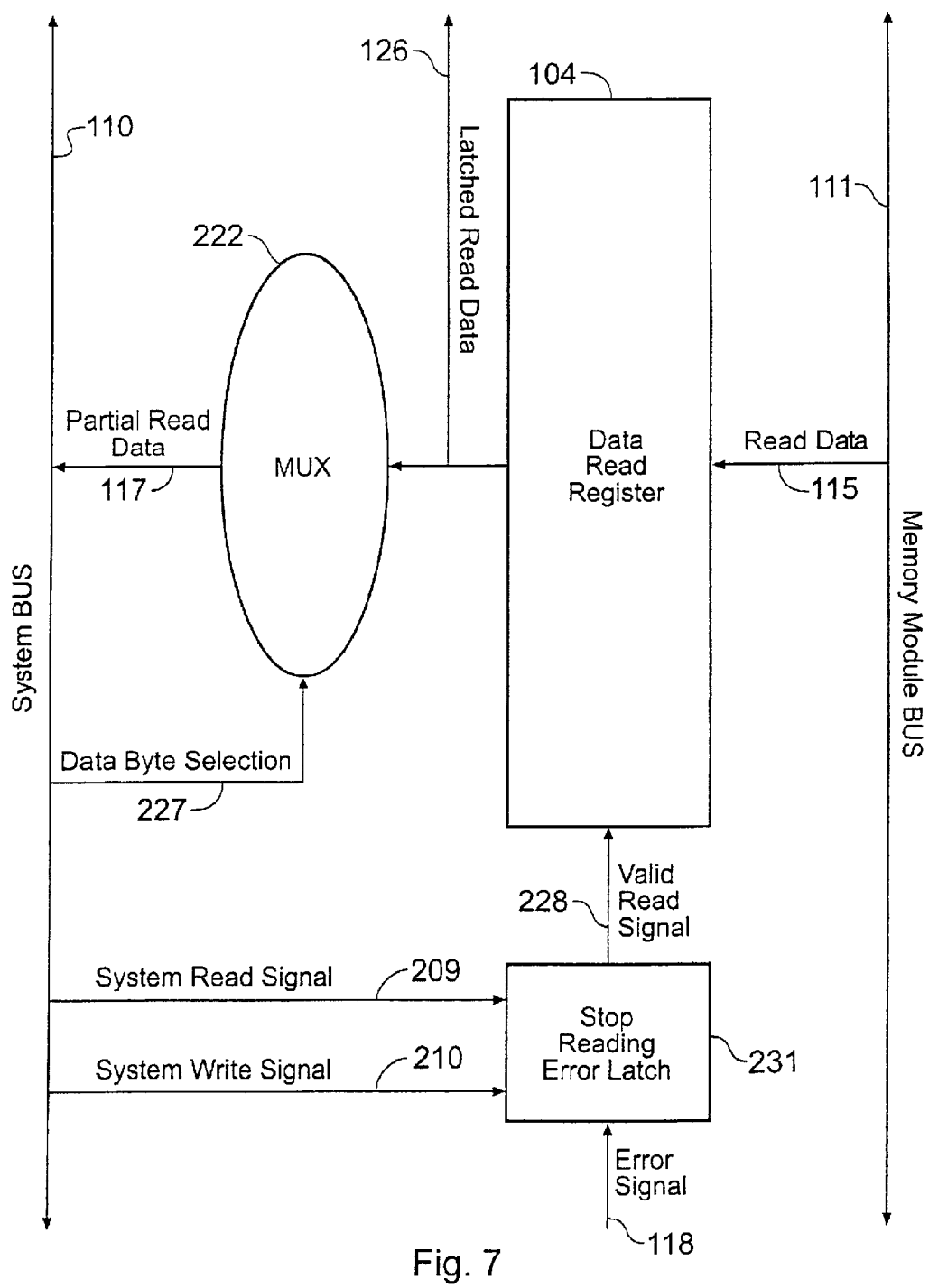
FIG. 7 is a block diagram showing the data read registers of FIG. 1 in more detail.

FIG. 7 shows the inputs to, and outputs from, the data read registers 104 of FIG. 1 in more detail. The data read registers 104 each consist of a 144 bit register that latches the contents of the memory module data bus 111 at the end of a read cycle. The 144 bit register then provides these data upon the memory module data bus 111 to the data comparators 103 as latched read data 126. The system read signal 209 provides a latching signal which is fed through a stop reading error latch 231. The latching signal can be stopped as it is fed through the stop reading error latch 231, which sets when an error is detected via the error signal 118. This means that subsequent reads will not pass through the stop reading error latch 231, and the data that failed comparison is held by the latch until the stop reading error latch 231 is cleared by a system write signal 230. This allows for the aforementioned multiple cycles to take place without affecting the data determined to be failure data and then latched. Thus, there is only an output on the valid read signal line 228 when the signal is not frozen.

The contents of the data read registers 104 can be read back to the smaller system bus 110 of the computer system 100 by using a multiplexer 222. The computer system 100 addresses the byte it needs to read back via a data byte selection signal 227 using the system bus 110. The read back byte is presented to the system bus 110 via the partial read data signals 117 described above.

Figure 8:
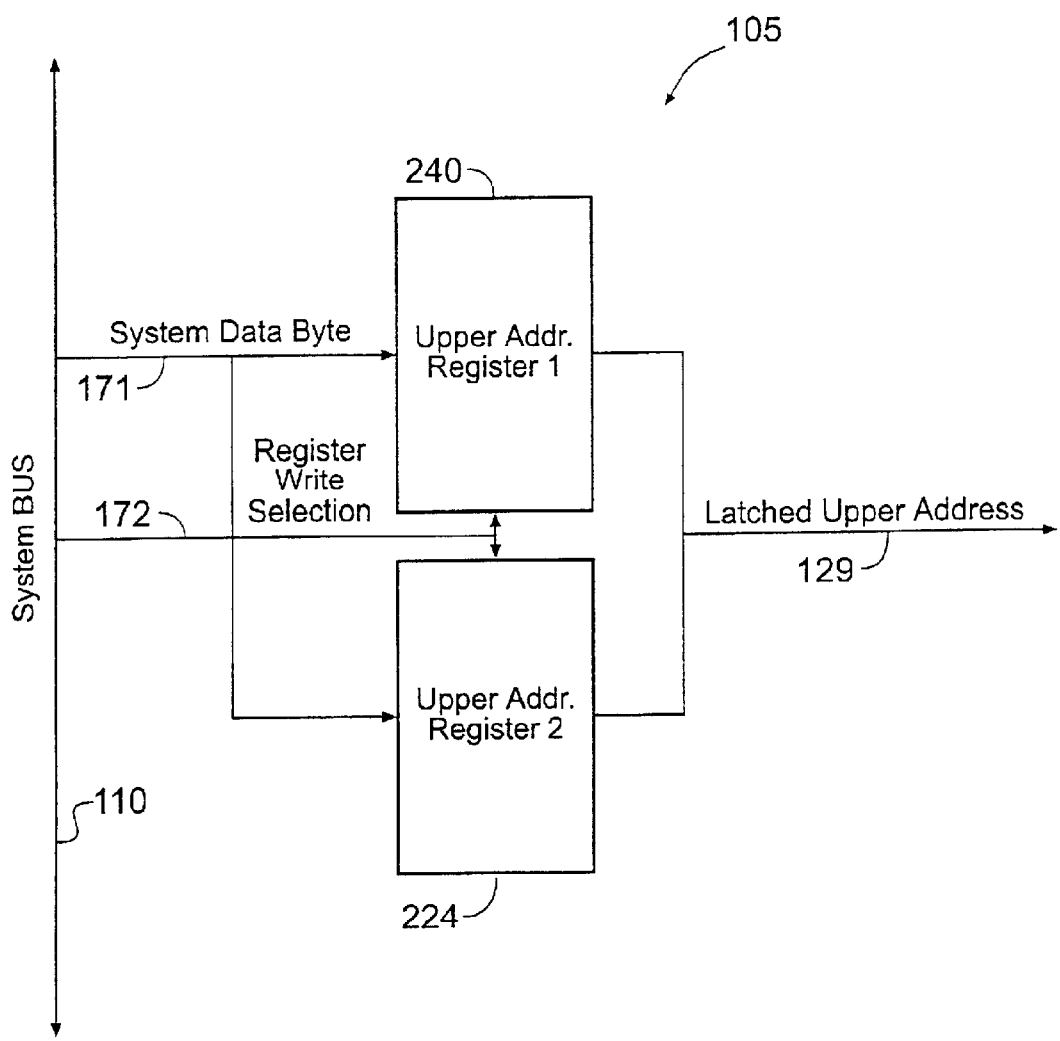
FIG. 8 is a block diagram showing the upper address registers of FIG. 1 in more detail.

FIG. 8 shows the inputs to, and outputs from, the upper address registers 105 of FIG. 1. The upper address registers consist of two 8 bit (one byte) wide write only registers 240 and 244. The computer system 100 loads the upper address data 130 into these registers using the system bus 110, effectively extending the addressing range of the CPU for the purposes of testing the DRAM. A register write selection signal 172 selects which of the two registers is to receive the byte from the system data byte 171. For the lower address lines which provide the lower address signals 128 (FIG. 1), 12 of the 20 address lines of the computer system 100 are used (from a memory mapped location). Thus the latched upper address 129 extends this to 28 bits (8 bits each from the two write only registers 240 and 244, and another 12 bits from the 12 address lines) giving an effective addressing range of 256 Mb ($2^{28}$ bytes). With the 18 byte (144 bit) wide data bus this gives a direct addressing capacity limit of 18×256 Mb=4.59 Gb.

Figure 9:
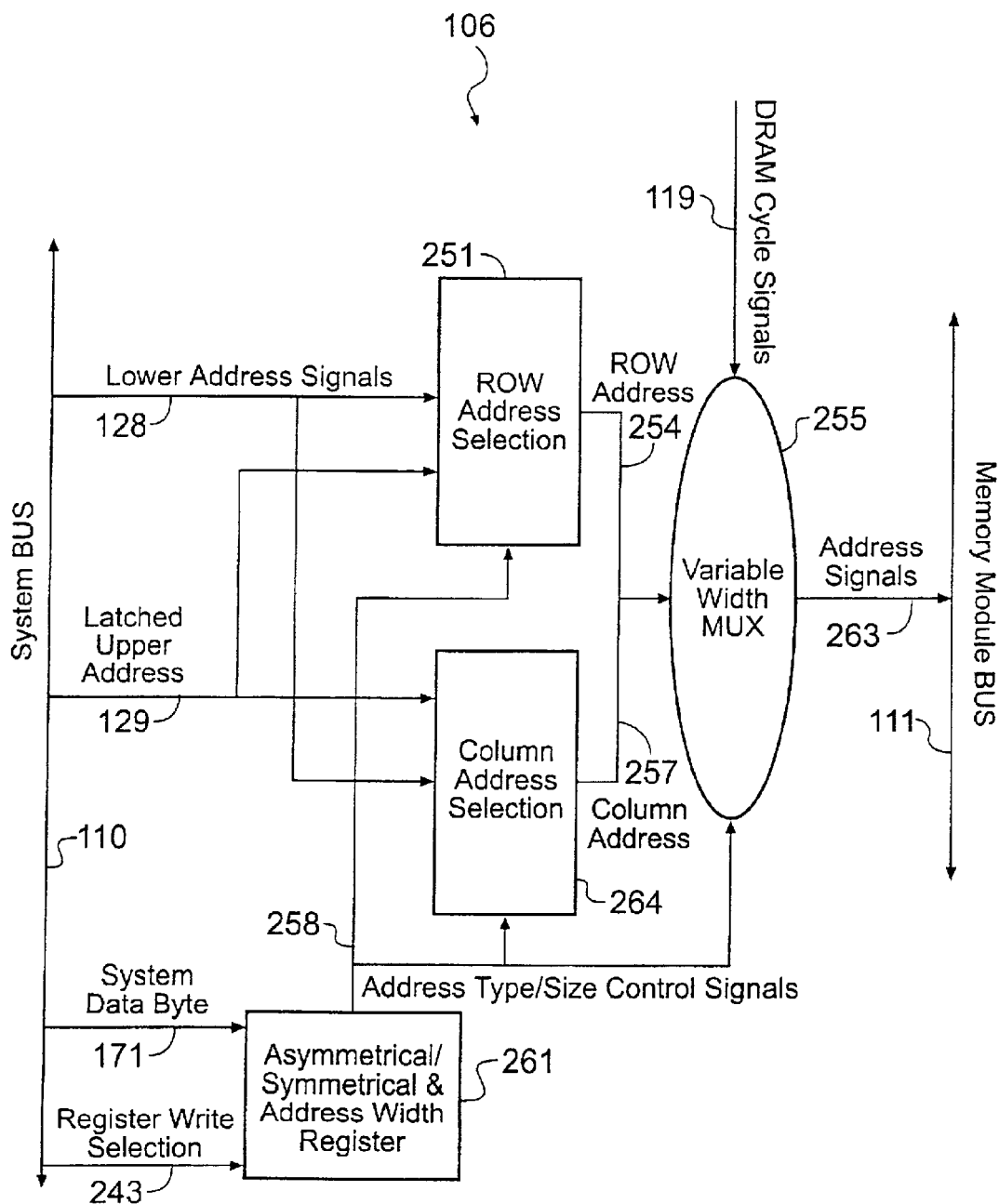
FIG. 9 is a block diagram showing the address generator of FIG. 1 in more detail.

FIG. 9 shows the address generator 106 of FIG. 1 in more detail. The latched upper address 129, and the lower address signals 128, interface directly to the address generator 106 via a row address selection 251 and column address selection 264 buffers. These combine to form a DRAM address from the linear address. The DRAM memory module 108 is addressed in two parts, i.e. as a row address 254 and a column address 257. To indicate which type of address is being presented to the memory module 108, two signals are used, known as the row address strobe (RAS) and column address strobe (CAS). During a read or write cycle the row address and then the column address are presented to the memory module 108 via the address signals 263 on the memory module bus 256 before data can be read or written. A variable width MUX 255 performs this function.

Depending upon the capacity and type of memory module 108, the way in which the linear address is split into the two parts can vary. The split position should be moved depending upon capacity and it can also be adjusted depending upon whether the module requires symmetrical or asymmetrical addressing. In symmetrical addressing, a 20 bit linear address (for example) would be split into a 10 bit row and 10 bit column address. In asymmetrical addressing, using the same example, the row address might be 9 bit and the column address 11 bit. This requirement is based upon the internal design of the RAM integrated circuits of the memory module 108.

An asymmetrical/symmetrical and address width register (ASAWR)261 is used to set the mode of addressing by the computer system 100 using the system bus 110, the system data byte 171 and the register write selection signal 243, as explained in connection with FIG. 8 above. The output of the ASAWR 261 is an address type/size control signal 258 which is used to control the size of the row and column address to be sent to the memory module 108 from the variable width MUX 255. Address widths from 20 bit to 28 bit can be pre-set in steps of 2 bits, with symmetrical and asymmetrical modes for each step, giving a total of 8 selections. Once set up, the address generator 106 passes on the linear address to the memory module 108 in synchronisation with the RAS and CAS signals 121 (FIG. 1) from the DRAM cycle signals 119. Thus, the address generator provides improved flexibility for the whole system, as it combines the address on the system bus 110 with the address on the memory module bus (111) in a manner which is transparent to the computer system 100.

Figure 10:
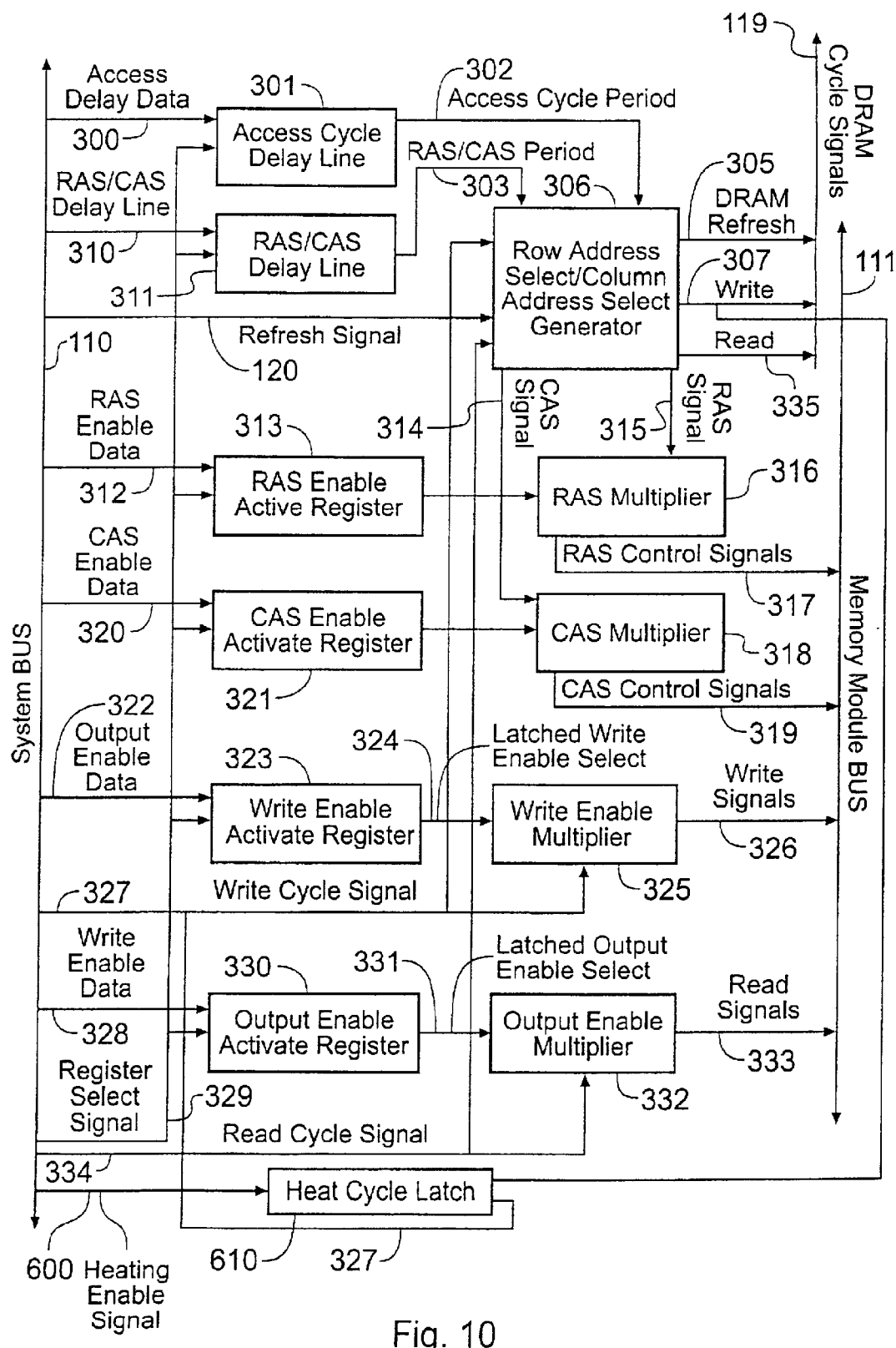
FIG. 10 is a block diagram showing the DRAM cycle controller of FIG. 1 in more detail.

Turning finally to FIG. 10, a more detailed view of the DRAM cycle controller 107 is shown. The DRAM cycle controller contains those components required to generate the signals for the memory module bus 111, as well as the DRAM cycle signals 119, from the system bus 110. As explained the RAS signals 317 and CAS signals 319 (part of the read/write and control signals 123 shown in FIG. 1) are used in the addressing of the memory module 108 and they also govern the overall access time of the memory module 108. This access time is typically a few nanoseconds and the entire cycle is then typically around 60 nS. During this, the row and column addresses must be presented and the data read or written from/to the memory module 108.

Independent enabling and disabling of the signals is implemented through enable activate registers. An RAS enable active register 313 receives RAS enable data 312 from the system bus 110 together with a register select signal 329 which activates that particular register.

The RAS enable activate register 313 output to an RAS multiplier 316, which also receives an RAS signal from a row address select/column address select generator 306. The RAS control signals 317 are sent to the memory module bus 111 from the RAS multiplier 316.

Likewise, a CAS enable activate register 321 receives CAS enable data 320 from the system bus 110, together with the register select signal 329. A CAS multiplier 318 generates the CAS control signals 319 in response to a CAS signal from the row address select/column address select generator 306 and the output of the CAS enable activate register 321.

A write enable activate register receives output enable data 322 from the system bus along with a register select signal 329. The output is a latched write enable select signal 324 which is fed to a write enable multiplier 325 together with a write cycle signal 327 from the system bus 110. Write signals 326 (again part of the read/write and control signals 127 of FIG. 1) are passed to the memory module bus 111 from the write enable multiplier 325.

An output enable activate register 330 is also provided. This receives write enable data 328 along with the register select signal 329. A latched output enable select signal 331 is then generated and used as one input to an output enable multiplier 332. The other input thereto is a read cycle signal taken off the system bus 110. The output enabling multiplier 332 sends read signals 333 to the memory module bus 111.

The RAS, CAS write enable and output enable multiplier registers 316, 318, 325 and 332 allow enabling of additional drive lines for memory modules 108 having multiple signal requirements, usually in the case where the memory module 108 is relatively large. In this embodiment, 4 lines each are available for the write signals 326 and the output signals 333, with 8 lines each being available for the RAS control signals 317 and the CAS control signals 319.

To govern the access of the memory module 108, two delay lines can be programmed in 0.5 nS steps. An access cycle delay line 301 determines the timing of the RAS signal 315 via an access cycle period 302 which is used as a further input to the row address select/columns address select generator 306. Again the access cycle delay line receives the register select signal 329, together with access delay data 300 from the system bus 110.

A RAS/CAS delay line 311 similarly determines the time between the start of the RAS signal 315 and the start of the CAS signal 314 via a RAS/CAS period 303, which is used as an input to the row address select/column address select generator 306. RAS/CAS delay data are received by the RAS/CAS delay line 311 along with the register select signal 329.

The row address select/column address select generator (RASCASG)306 provides the control signals on a bus which distributes the DRAM cycle signals to the other sections of the test system 127. Read and write cycle signals 335, 307 are passed on with a DRAM refresh signal 305. The refresh signal 120 identifies when the contents of the memory module 108 are to be refreshed, and all other operations are then halted during that period. The RASCASG 306 also provides a combined RAS signal 315 and CAS signal 314 (not shown) in line with the memory module specifications during this period.

During a cycle, the computer system 100 asserts the write cycle signal 307 or the read cycle signal 335. This allows the RASCASG 306 to start the RAS signal 315 and, after the RAS/CAS period 303 has expired, to start the CAS signal 314. After the access cycle period 302 has expired the RAS signal 315 and CAS signal 314 are de-asserted. If the refresh signal 120 on the system bus is asserted, the RAS signals 315 and CAS signals 314 are asserted and all other signals de-asserted during that period. Because the computer system 100 is suspended during this period no conflicting read/write cycle is attempted. This solution makes use of the internal memory control unit (MCU)156 (FIG. 3) of the computer system 100 to suspend all functions during a refresh period. This reduces the amount of logic that would be necessary if an external refresh function were to be used.

The CPU can enable a special heating cycle that can take advantage of the structure of the tester as described above. When this heating cycle is required, the CPU enables a heat cycle latch 610 via a heating enable signal 600. This combines the write cycle signal 327 with the write DRAM cycle signal 307. In this mode, when the CPU commences with a standard write cycle, the write DRAM cycle signal 307 will reinitiate the write cycle signal 327 again as soon as the last cycle is finished. There is no governor to this mechanism so it will free run asynchronously to the standard write cycle until the register is disabled. The cycles repeat too quickly for internal data to be latched successfully by the DRAM, but the logic is still exercised and it is exercised much more rapidly than normal. The rapid cycle therefore causes the DRAM module to consume more power, which is dissipated as heat. If run over a period of time, the whole memory module will experience a significant temperature rise above ambient that can then be used, before it cools, during subsequent tests. These tests will be more effective at finding errors due to the higher temperatures having a degrading effect on the performance of the DRAM.

Although particular embodiments of the invention have been described herein, numerous variations and modifications will become apparent to those skilled in the art that fall within the spirit and scope of the present invention.

Although the aforementioned system and method has been described with respect to testing DRAM modules it will be understood that the method and system described herein is applicable to any logic system that requires a full speed, full bus width test and must reproduce repeatable responses to test patterns.

What is claimed is:

1. An electronic memory device tester, comprising:
   an input, arranged to receive seed data which has a first number, p, of seed data bits, from a computer; and
   a data generator arranged to generate an array of prepared data having a second number, q, of prepared data bits, where q>p, and arranged to generate from the prepared data a test data pattern for writing to an electronic memory device to be tested.

2. The memory tester of claim 1, in which the data generator comprises:
a plurality of data write registers arranged to receive the seed data from the computer and to generate therefrom the said prepared data; and
a test pattern generator arranged to generator one of a plurality of test data patterns from the prepared data.

3. The memory tester of claim 2, in which each data write register comprises an 8 bit data latch to which an 8 bit seed data word may be individually written.

4. The memory tester of claim 3, in which each of the 8 bit data latches is arranged to receive the same 8 bit seed data word.

5. The memory tester of claim 3, in which at least some of the 8 bit data latches are arranged to receive different 8 bit seed data words.

6. The memory tester of claim 1, in which the input is further arranged to receive a clock signal from the computer and to control the writing of the test data pattern to the memory device on the basis of that clock signal.

7. The memory tester of claim 1, further comprising:
a data reader arranged to read the test data pattern that has been written to the electronic memory device, and a data comparator to compare it with the test data pattern generated by the data generator, and to provide an output indicative of errors in the memory device being tested.

8. The memory tester of claim 7, in which the output of the data comparator is an error signal, and wherein, in response to the error signal being generated, the data reader is arranged to stop reading test data written to the memory device.

9. The memory tester of claim 7, further comprising a multiplexer arranged to receive failure data representative of errors in the memory device to be tested, and to output multiplexed failure data.

10. The memory tester of claim 1, further comprising an address generator arranged to generate a memory address representative of an address in the memory device to be tested, and to which test data from the test data pattern is to be written.

11. The memory tester of claim 10, further comprising a plurality of upper address registers arranged to receive upper address data from a computer and to generate a latched upper address signal therefrom.

12. The memory tester of claim 11, in which the address generator receives, as a first input, the said latched upper address signal, and receives as a second input, a lower address signal from the computer, the memory address being generated in dependence upon the upper and lower address signals under the control of a clock signal.

13. The memory tester of claim 12, in which the address generator generates an address command identifying a linear memory address as the combination of a row address and a column address.

14. The memory tester of claim 13, further comprising an addressing mode selector arranged to adjust the address command so that linear memory addresses of different widths may be addressed, and/or to adjust the address command so as to switch the addressing mode between symmetric and asymmetric.

15. The memory tester of claim 1, further comprising a memory heater arranged to heat the memory device when in use.

16. The memory tester of claim 15, in which the memory heater comprises a heat cycle latch arranged to increase the cycle rate of a write cycle signal for output to the memory device, so as to cause an increase in the heat dissipated by the memory device when in use.

17. Apparatus comprising:
a computer system comprising a central processing unit in communication with a computer system bus, and means for controlling access to the computer system bus;
an electronic memory device in communication with a memory device bus, the memory device having a plurality of readable and writable memory elements; and
an electronic memory device tester comprising:
an input, arranged to receive seed data which has a first number, p, of seed data bits, from a computer; and
a data generator arranged to generate an array of prepared data having a second number, q, of prepared data bits, where q>p, and arranged to generate from the prepared data a test data pattern for writing to an electronic memory device to be tested;
wherein the computer system is arranged to generate the seed data, the memory tester is arranged to receive the seed data at its input via the computer system bus, and the memory device is arranged to receive the test pattern data from the memory tester via the memory device bus.

18. The apparatus of claim 17, in which the computer system bus has a first bus width and the memory device bus has a second bus width larger than the first bus width.

19. A method of writing data to an electronic memory device to be tested, comprising the steps of:
(a) generating, in a separate computer, seed data having a first number, p, of seed data bits;
(b) receiving, in a memory tester, the seed data;
(c) generating, from the received seed data, an array of prepared data having a second number, q, of prepared data bits, where q>p;
(d) generating, from the prepared data, a test data pattern; and
(e) writing the test data pattern to the electronic memory device to be tested.

20. The method of claim 19, in which the step (c) of generating the array of prepared data further comprises:
writing the received seed data to each of a plurality of data latches.

21. The method of claim 20, further comprising writing the same received seed data to each of the plurality of data latches.

22. The method of claim 20, further comprising writing a first array of received seed data to a first data latch, and writing at least one further array of different received seed data to at least one further data latch.

23. The method of claim 19, further comprising:
receiving in the memory tester, a clock signal from the computer; and
controlling the writing of the test data pattern to the memory device on the basis of that clock signal.

24. A method of testing an electronic memory device, comprising:
writing test data to the memory device, the writing of test data comprising the steps of:
(a) generating, in a separate computer, seed data having a first number, p, of seed data bits;

(b) receiving, in a memory tester, the seed data;

(c) generating, from the received seed data, an array of prepared data having a second number, q, of prepared data bits, where q>p;

(d) generating, from the prepared data, a test data pattern; and (e) writing the test data pattern to the electronic memory device to be tested reading the test data pattern previously written to the memory device;

comparing the read test data pattern with the test data pattern that was written to the memory device; and generating an output indicative of errors in the memory device under test, when the said read test data pattern does not match the said written test data pattern.

25. The method of claim 24, in which the generated output is an error signal, the method further comprising:

the step of reading the test pattern data in response to the generated error signal.

26. The method of claim 19, further comprising:

receiving, in the memory tester, upper address data from the computer;

generating a latched upper address signal therefrom;

receiving, in the memory tester, a lower address signal from the computer; and addressing the memory device to be written to in dependence upon the upper and lower address signals, under the control of a clock signal.

27. The method of claim 26, further comprising:

generating an address command identifying a linear memory address by a combination of a row address and a column address within the memory device.

28. The method of claim 27, further comprising:

adjusting the address command to permit linear memory addresses of different address widths to be addressed.

29. The method of claim 27, further comprising:

adjusting the address command to permit either symmetric or asymmetric linear memory addresses to be addressed.

30. The method of claim 19, in which the memory device to be tested is Dynamic Random Access Memory (DRAM), the method further comprising:

refreshing the DRAM on a periodic basis under the control of the external computer.

31. An electronic memory device tester, comprising:

input means for receiving seed data which has a first number, p, of seed data bits, from processing means comprising a computer; and data generator means for generating an array of prepared data having a second number, q, of prepared data bits, where q>p, and arranged to generate from the prepared data a test data pattern for writing to an electronic memory device to be tested.

* * * * *